(12) United States Patent
McPherson et al.

(10) Patent No.: US 11,487,335 B1
(45) Date of Patent: Nov. 1, 2022

(54) TABLET COOLING DEVICE AND METHOD OF USE

(71) Applicants: John McPherson, Dripping Springs, TX (US); Stephen C Roberts, Buda, TX (US)

(72) Inventors: John McPherson, Dripping Springs, TX (US); Stephen C Roberts, Buda, TX (US)

(*) Notice: Subject to any disclaimer, the term of this patent is extended or adjusted under 35 U.S.C. 154(b) by 67 days.

(21) Appl. No.: 17/216,331

(22) Filed: Mar. 29, 2021

(51) Int. Cl.
*G06F 1/20* (2006.01)
*H05K 7/20* (2006.01)
*F25B 21/02* (2006.01)

(52) U.S. Cl.
CPC .............. *G06F 1/203* (2013.01); *F25B 21/02* (2013.01); *G06F 1/206* (2013.01); *H05K 7/20254* (2013.01); *H05K 7/20272* (2013.01); *H05K 7/20281* (2013.01); *F25B 2321/0252* (2013.01); *G06F 2200/201* (2013.01)

(58) Field of Classification Search
None
See application file for complete search history.

(56) References Cited

U.S. PATENT DOCUMENTS

| 6,226,994 | B1* | 5/2001 | Yamada | H01L 35/32 136/203 |
| 8,464,547 | B2* | 6/2013 | Hsu | G06F 1/203 165/122 |
| 10,691,186 | B1* | 6/2020 | McPherson | G06F 1/203 |
| 2005/0126184 | A1* | 6/2005 | Cauchy | H01L 35/30 62/3.3 |
| 2008/0016881 | A1* | 1/2008 | Steffensen | F25B 21/04 62/3.2 |
| 2022/0208647 | A1* | 6/2022 | Gao | H05K 7/20163 |

* cited by examiner

*Primary Examiner* — Courtney L Smith
(74) *Attorney, Agent, or Firm* — Leavitt Eldredge Law Firm

(57) ABSTRACT

A tablet cooling device includes a copper plate, having a fan mounted on the coper plate to direct airflow; a heat sink secured directly under the fan; a thermal control board to control and regulate the fan and heat sink; and a peltier cooler secured underneath the heat sink; a sub cooling plate, having a circulation channel embedded in the sub cooling plate; a liquid mixture is circulated through the circulation channel; a power source; the thermal control board detects temperature to maintain a predetermined temperature range via active and passive cooling.

5 Claims, 6 Drawing Sheets

TABLET COOLING DEVICE AND METHOD OF USE

BACKGROUND

1. Field of the Invention

The present invention relates generally to tablets, especially as used in aviation systems, and more specifically to a tablet cooling device and method incorporating both active and passive cooling.

2. Description of Related Art

Tablets are well known in the art and are commonly used for navigation and communication in aviation. For example, FIG. 1 depicts a conventional tablet 101 having a screen 103 wherein the user can receive information and manipulate various software and controls.

One of the problems commonly associated with tablet 101 is overheating. For example, when a tablet, or other computing device, is used for long periods of time, the tablet can become overheated and therefore malfunction. It is particularly important when using the tablet for aviation, that the tablet remain in working order.

Accordingly, there lies a need for tablet cooling devices that keep tablets cool and in working condition.

DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

Figure 1:
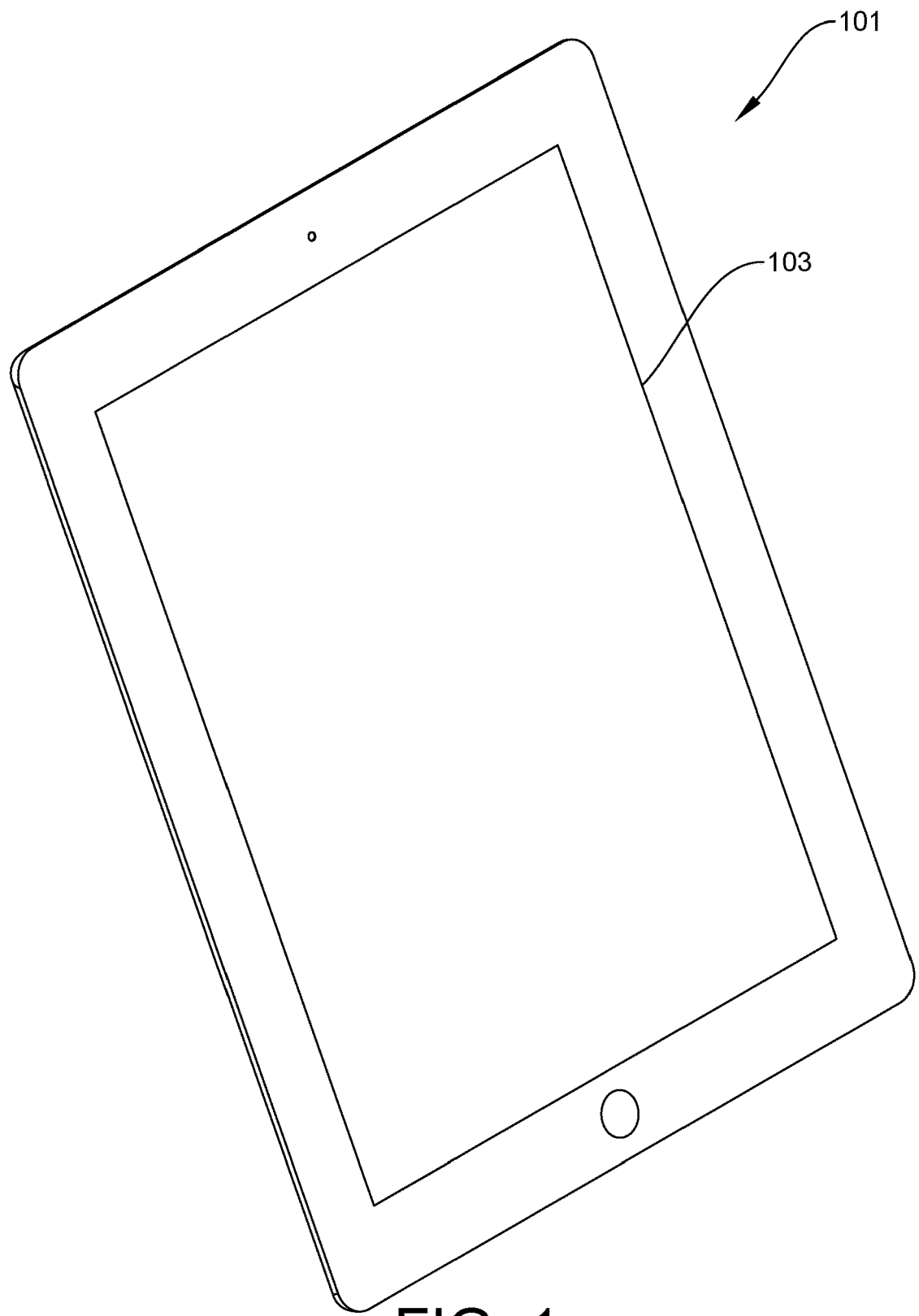
FIG. 1 is an oblique view of a common tablet.

While the system and method of use of the present application is susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the present application as defined by the appended claims.

DETAILED DESCRIPTION OF THE PREFERRED EMBODIMENT

Illustrative embodiments of the system and method of use of the present application are provided below. It will of course be appreciated that in the development of any actual embodiment, numerous implementation-specific decisions will be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The system and method of use in accordance with the present application overcomes one or more of the above-discussed problems commonly associated with conventional tablets. Specifically, the present invention provides a tablet cooling apparatus configured to use both active and passive cooling, thereby providing an efficient means to cool a tablet in use. These and other unique features of the system and method of use are discussed below and illustrated in the accompanying drawings.

The system and method of use will be understood, both as to its structure and operation, from the accompanying drawings, taken in conjunction with the accompanying description. Several embodiments of the system are presented herein. It should be understood that various components, parts, and features of the different embodiments may be combined together and/or interchanged with one another, all of which are within the scope of the present application, even though not all variations and particular embodiments are shown in the drawings. It should also be understood that the mixing and matching of features, elements, and/or functions between various embodiments is expressly contemplated herein so that one of ordinary skill in the art would appreciate from this disclosure that the features, elements, and/or functions of one embodiment may be incorporated into another embodiment as appropriate, unless described otherwise.

The preferred embodiment herein described is not intended to be exhaustive or to limit the invention to the precise form disclosed. It is chosen and described to explain the principles of the invention and its application and practical use to enable others skilled in the art to follow its teachings.

Figure 2:
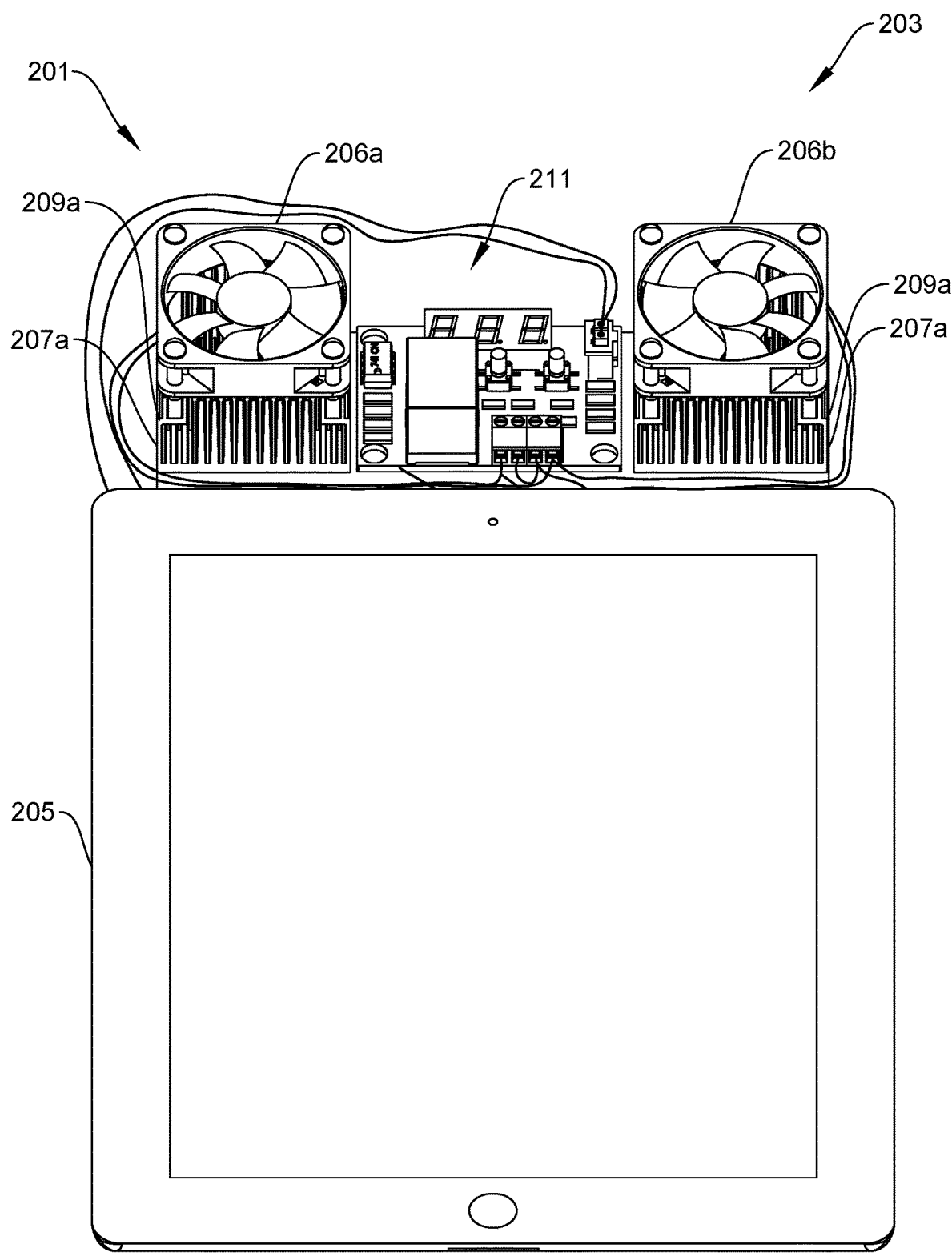
FIG. 2 is a top view of a tablet cooling system in accordance with a preferred embodiment of the present application.

Referring now to the drawings wherein like reference characters identify corresponding or similar elements throughout the several views, FIG. 2 depicts a top view of a tablet cooling system in accordance with a preferred embodiment of the present application. It will be appreciated that system 201 overcomes one or more of the above-listed problems commonly associated with conventional tablets.

In the contemplated embodiment, system 201 includes a tablet cooling apparatus 203 configured to be secured underneath a tablet 205. It should be appreciated that a variety of mounting means, including straps, brackets, adhesives, and any other means known in the art, could be used to secure the tablet to the cooling apparatus. Further, it must be understood that the cooling apparatus could be adapted to fit a plurality of various forms of tablets.

Figure 3:
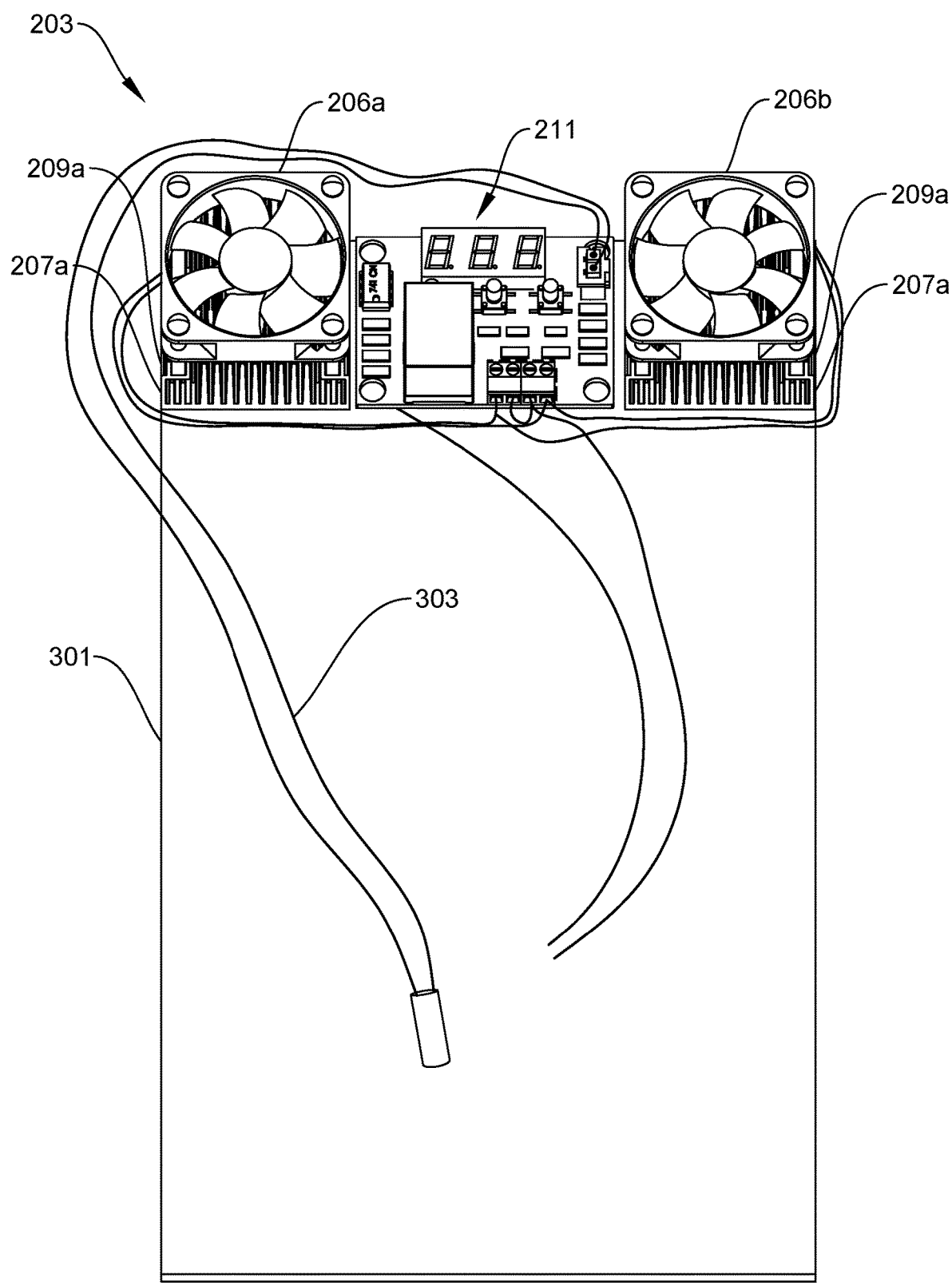
FIG. 3 is a top view of a tablet cooling apparatus of FIG. 2.
Figure 4:
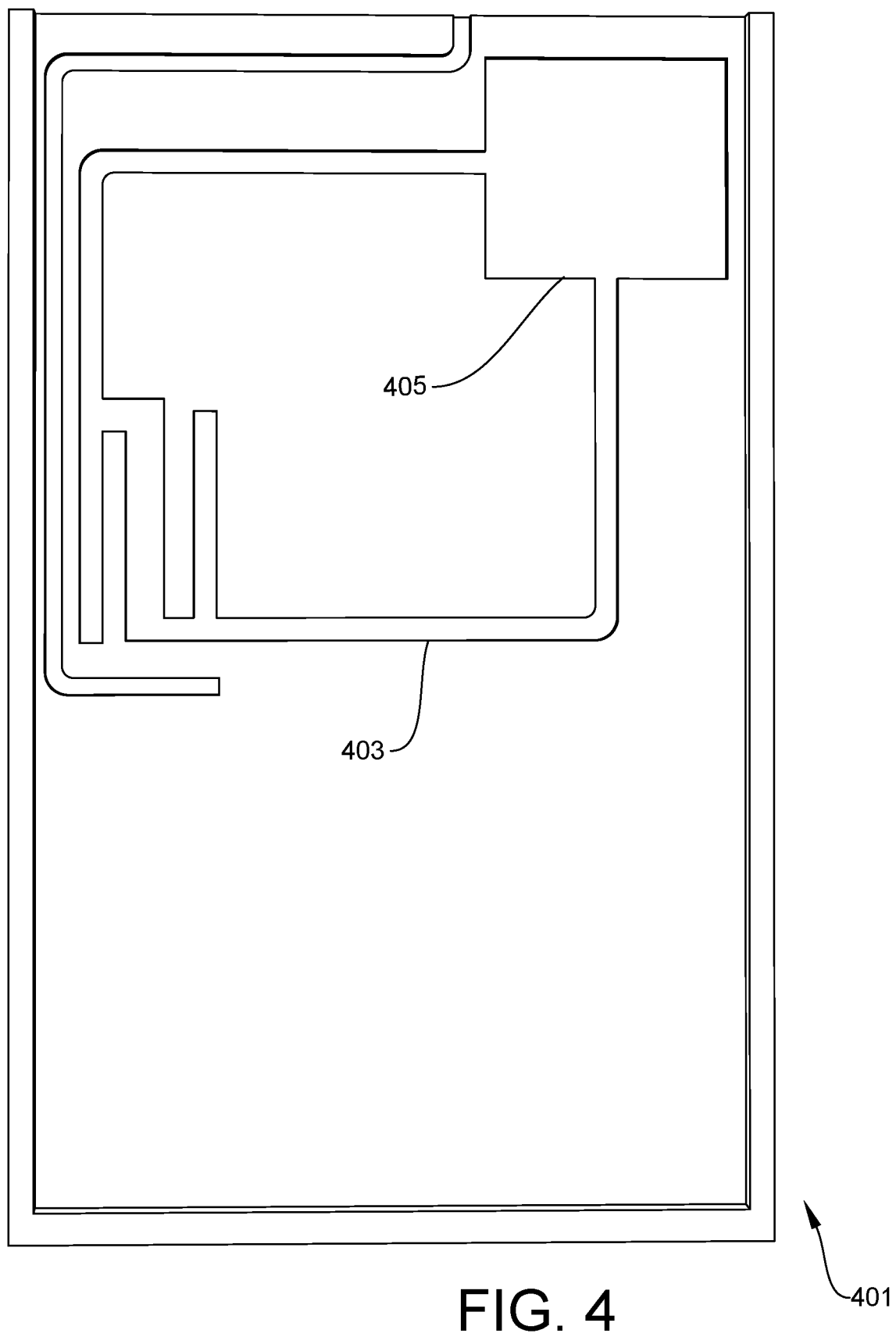
FIG. 4 is a top view of a sub cooling plate configured to be secured underneath the tablet cooling apparatus of FIG. 3.

As further shown in FIG. 3, cooling apparatus 203 includes a copper plate 301 to be positioned directly underneath the tablet. Copper plate 301 is positioned directly on top of a sub cooling plate 401 (not visible in FIGS. 2 and 3). The copper plate 301 is cooled to thereby pull heat from the tablet.

In the preferred embodiment, one or more fans 206a-b are mounted on the copper plate, preferably in a position above the tablet. The fans 206a-b are directly over one or more heat sinks 207a-b, being further directly over the top of one or more Peltier coolers 209a-b. It should be appreciated that the one or more Peltier coolers, along with the one or more heat sinks 207a-b, and one or more fans 206a-b, pull heat from the copper plate, thereby ensuring temperature regulation of the copper plate.

Apparatus 203 can further include a thermal control board 211 configured to control and regulate the various components of the system to maintain a cool temperature. In addition, as shown in FIG. 3, apparatus 203 includes a plurality of wires 303 to allow for connection of the various components. Further, one or more power sources are included.

The copper plate 301 is secured directly on top of the sub cooling plate 401, the sub cooling plate having one or more channels 403 and reservoirs 405 to receive and circulate a liquid solution. In the preferred embodiment, the liquid solution is a propylene glycol with isopropyl alcohol, which provides for improved vaporization and heat transfer. Further, in sub cooling plate 401 is adapted to receive the wires and a temperature probe (not shown) which is in communication with the thermal control board. Although the channels of the sub cooling plate can vary, in the preferred embodiment, the channel positioned across the top and down the left-hand side is particularly configured to receive the thermal probe and wires. The channel extending away from the reservoir 405 to the left is larger than the channel that extends down from the reservoir 405, these two channels meet in a configuration of channels that are thinner and therefore allow for improved evaporation. Further, in the preferred embodiment, it should be appreciated that one of the one or more Peltier coolers is positioned directly on top of the reservoir 405, thereby cooling the liquid contained therein.

It should be appreciated that one of the unique features believed characteristic of the present application is the combined features of liquid circulation, along with the combination of heat sinks, fans, and Peltier coolers, which allows for improved cooling of a tablet.

Figure 5:
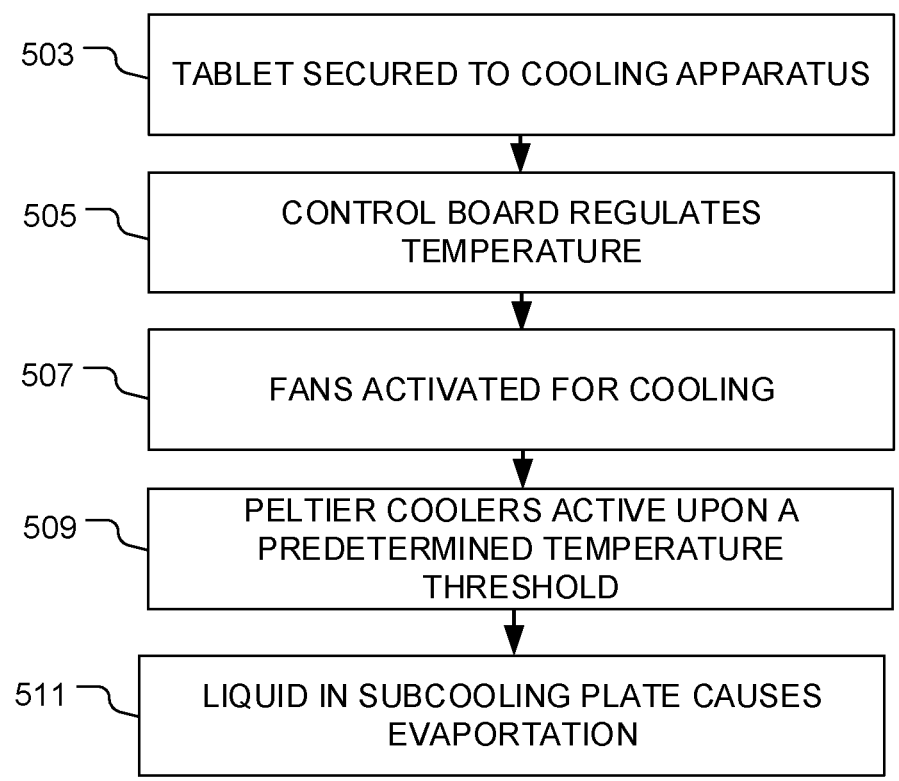
FIG. 5 is a flowchart of the method of use of the system of FIG. 2.

In FIG. 5, a flowchart 501 depicts the method of use of the apparatus of the present invention. The tablet is secured to the cooling apparatus by any known means in the art, as shown with box 503. As the tablet is used and begins to heat up, the control board begins regulating the temperature, as shown with box 505. The fans are activate, thereby pulling air through the heat sinks and thereby cooling the copper plate, as shown with box 507. The Peltier coolers cool over a short duration, reducing heat in the copper plate and allowing a great thermal differentiation, as shown with box 509. It should be appreciated that the cooling apparatus is designed to only activate the Peltier coolers upon reaching a predetermined temperature, such as 104 degrees Fahrenheit. Further, the liquid in the subcooling plate further pulls heat from the copper plate, thereby still reducing the temperature of the tablet, as shown with box 511.

It should be appreciated that the exact arrangement and materials can vary. However, in the preferred embodiment, the Peltier coolers are 5 volts and 1.25 amps. In addition, the subcooling plate can vary in materials, however, the preferred material is a foam like material.

Figure 6:
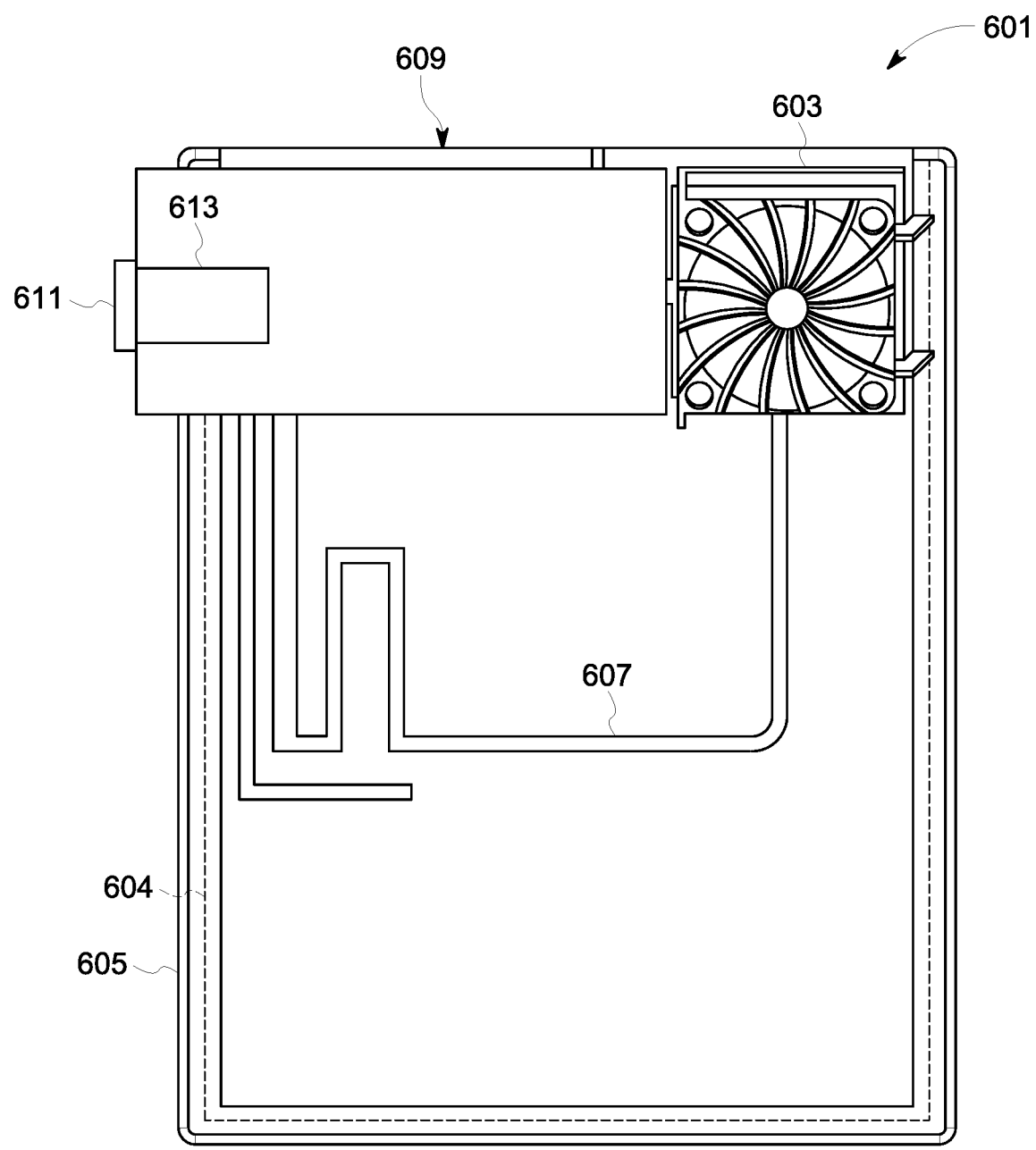
FIG. 6 is a top view of an alternative embodiment of a tablet cooling apparatus in accordance with the present application.

In FIG. 6, an alternative embodiment of tablet cooling system 601 is shown. System 601 may include some or all of the features discussed above. System 601 including a fan 603 and a sub cooling plate 605, the sub cooling plate 605 having channels 607 connected to a reservoir as discussed above. System 301 may further include a metal plate 604 that is positioned behind the sub cooling plate 605. The reverse side metal plate 604 is configured for thermal transfer is to enable other devices to use it such as laptops and handhelds. System 601 may further include various electrical components 609 as discussed above. In this embodiment, only a single fan is used. In addition, system 601 includes charging capabilities using a 12v barrel connector 611 for charging a power source, such as a batter. In addition, the system utilizes an integrated charging circuit 613 and can operate from 12V to 5V using the 12V battery. In this embodiment, the plate is approximately 8 mm in height.

The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed is:

1. A tablet cooling device, comprising:
   a copper plate, having:
      a fan mounted on the copper plate and configured to direct airflow;
      a heat sink secured directly under the fan;
      a thermal control board configured to control and regulate the fan and heat sink; and
      a peltier cooler secured underneath the heat sink;
   a sub cooling plate, having:
      a circulation channel embedded in the sub cooling plate;
      wherein a liquid mixture is configured to circulate through the circulation channel, the liquid is propylene glycol with an isopropyl alcohol; and
      a fluid reservoir in fluid communication with the circulation channel, the fluid reservoir is positioned underneath the fan;
   a 12V barrel connector for charging a power source;
   wherein the thermal control board detects temperature to maintain a predetermined temperature range via active and passive cooling.

2. The tablet cooling device of claim 1, wherein the liquid mixture comprises:
   a predetermined amount of glycol;
   a predetermined amount of distilled water;
   a predetermined amount of a corrosion inhibitor; and
   a predetermined amount of isopropyl alcohol.

3. The tablet cooling device of claim 1, further comprising an electrical system having integrated charging circuit.

4. The tablet cooling device of claim 1, wherein the sub cooling plate is approximately 8 mm in height.

5. The tablet cooling device of claim 1, further comprising:
   a metal plate positioned underneath the sub cooling plate.

* * * * *